United States Patent
Lin

(10) Patent No.: US 12,267,054 B2
(45) Date of Patent: Apr. 1, 2025

(54) SYSTEMS, METHODS, AND DEVICES FOR DIRECT SAMPLING IN DATA CONVERTERS

(71) Applicant: Cypress Semiconductor Corporation, San Jose, CA (US)

(72) Inventor: Adrian Lin, Austin, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 209 days.

(21) Appl. No.: 18/307,625

(22) Filed: Apr. 26, 2023

(65) Prior Publication Data

US 2024/0364288 A1 Oct. 31, 2024

(51) Int. Cl.
*H03G 3/30* (2006.01)
*H03M 1/12* (2006.01)

(52) U.S. Cl.
CPC ............... *H03G 3/30* (2013.01); *H03M 1/12* (2013.01); *H03G 2201/103* (2013.01)

(58) Field of Classification Search
CPC ...... H03G 3/30; H03G 2201/103; H03M 1/12
See application file for complete search history.

(56) References Cited

U.S. PATENT DOCUMENTS

2011/0210795 A1\* 9/2011 Ohta ..................... H03F 1/56
330/288

\* cited by examiner

*Primary Examiner* — Joseph J Lauture

(57) ABSTRACT

Systems, methods, and devices provide sampling for data converters. Methods include receiving a voltage from a voltage source, and identifying transconductance parameters and resistance parameters associated with a data converter, the transconductance parameters identifying a transconductance of the data converter. Methods also include selecting a resistor from a plurality of dynamically selectable resistors based on the resistance parameters, generating, using a programmable gain amplifier, a current based, at least in part, on the selected resistor and the received voltage, and providing the current to the data converter.

20 Claims, 14 Drawing Sheets

SYSTEMS, METHODS, AND DEVICES FOR DIRECT SAMPLING IN DATA CONVERTERS

TECHNICAL FIELD

This disclosure relates to data converters, and more specifically, to enhancement of sampling in such data converters.

BACKGROUND

Devices may include power management systems to monitor power levels of power supplies, such as batteries. Such power management systems may include components that use reference voltages to perform such monitoring and associated measurements. Conventional techniques for monitoring power supplies remain limited because they require additional hardware resources when an operational range of the power supply being monitored exceeds that of the component of the power management system that is performing the monitoring. Such additional hardware resources may result in increased current consumption and reduced efficiency of the power management system.

DETAILED DESCRIPTION

Figure 1:
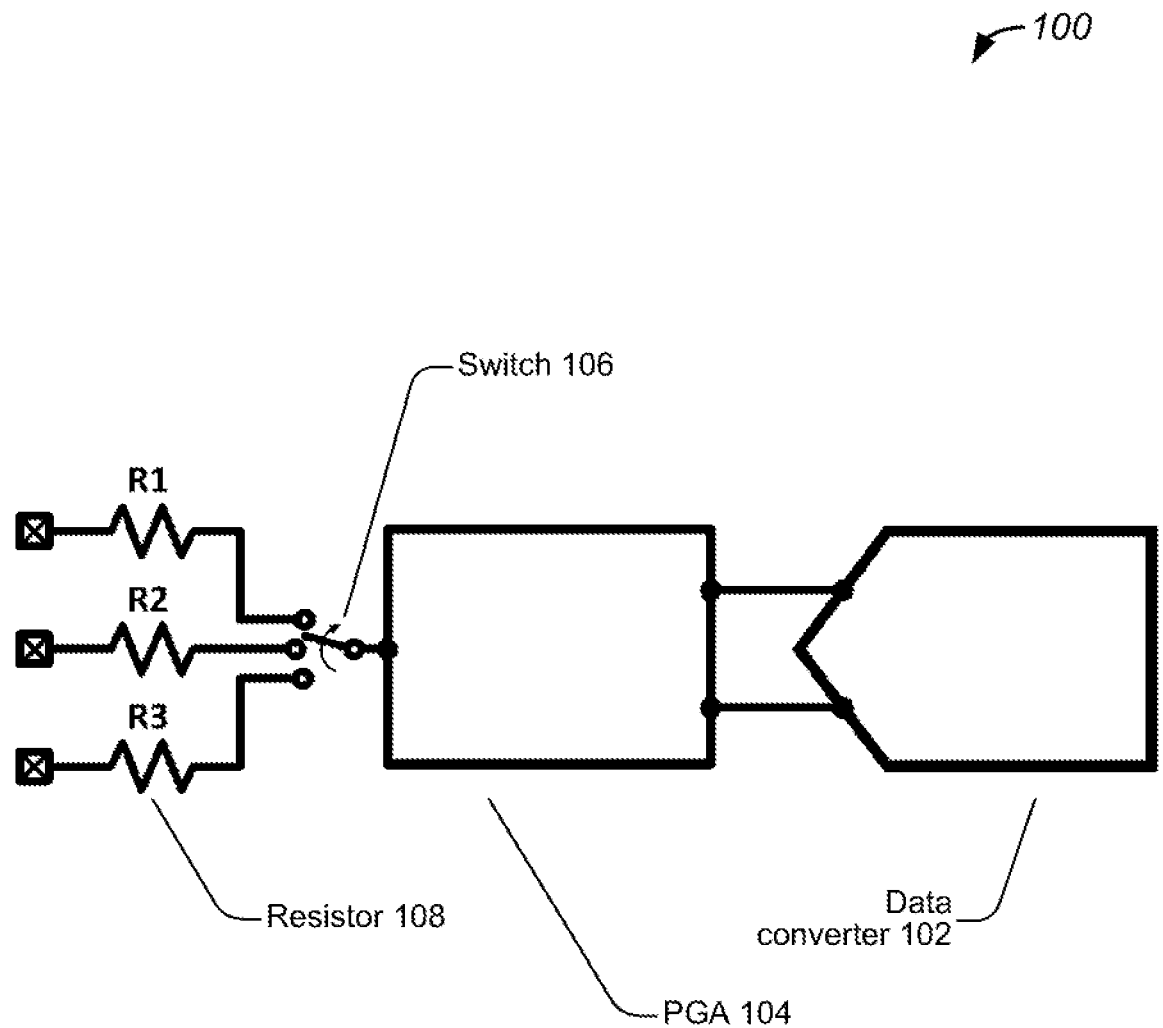
FIG. 1 illustrates an example of a data sampling configuration for data converters, configured in accordance with some embodiments.

In the following description, numerous specific details are set forth in order to provide a thorough understanding of the presented concepts. The presented concepts may be practiced without some or all of these specific details. In other instances, well known process operations have not been described in detail so as not to unnecessarily obscure the described concepts. While some concepts will be described in conjunction with the specific examples, it will be understood that these examples are not intended to be limiting.

Power management systems may included components, such as data converters, that are used to perform measurement operations to measure voltage levels of a power supply being monitored. When an operational range of the power supply exceeds the operational range of the data converter, such as when the amplitude of the power supply is greater than a reference voltage used by the data converter, the data converter is not able to directly sample power supply, and conventional techniques often use a voltage divider to step down the sampled voltage, and compress the operational range to that of the data converter.

Conventional techniques implement such voltage dividers by using large scaling resistors that may be coupled between the power supply and a circuit ground to perform the voltage division. Accordingly, a first and second resistor may be coupled serially between the power supply and ground. Moreover, a first input terminal of an amplifier may be coupled between the first and second resistor via a third resistor, and a second input terminal of the amplifier may be coupled to ground via a fourth resistor. In this way, conventional techniques may use a voltage divider at an input of an amplifier coupled to an input of the data converter.

When configured this way, current constantly flows through the voltage divider and consumes current. Often, the value of the scaling resistors is configured to be relatively high to reduce such constant currents. However, high scaling resistor values then require an even higher input resistor for components of the power management system such that components, such as the data converter, don't constantly draw current. This additionally results in a high input impedance and an inefficient implementation of a power management system.

Embodiments disclosed herein provide the implementation of dynamically selectable resistors to adjust an input resistance of an amplifier coupled to a data converter. Accordingly, as will be discussed in greater detail below, no voltage divider is required, and the dynamically selectable resistors are configured to compensate for changes in an input voltage and ensure that the data converter is provided with a consistent current. In some embodiments, the amplifier and data converter are implemented using inverters instead of resistors. Accordingly, embodiments disclosed herein avoid the use of large scaling and feedback resistors, and reduce an overall current consumption of power management systems.

FIG. 1 illustrates an example of a data sampling configuration for data converters, configured in accordance with some embodiments. As will be discussed in greater detail below, a system, such as system 100, may be configured to provide data sampling capabilities for a data converter even when a sampled signal exceeds an operational range of a data converter. Accordingly, various embodiments disclosed herein provide beyond rail direct sampling capabilities for data converters.

In various embodiments, system 100 includes data converter 102. As shown in FIG. 1, data converter 102 is an analog to digital converter (ADC). Accordingly, data converter 102 may be configured to receive an analog input, and convert that input to a digital output. More specifically, data converter 102 may include various inverters that may be used in combination with one or more reference voltages to generate a digital output determined based on a received analog input. As will be discussed in greater detail below, the reference voltages used by data converter 102 may also be referred to herein as rails, and may be set to designated voltages that may be determined by an entity, such as a manufacturer. For example, a reference voltage used by data converter 102 may 1.8V.

System 100 further includes programmable gain amplifier (PGA) 104 which is configured as a front-end amplifier for data converter 102, and thus provides amplification for an input of data converter 102. In various embodiments, PGA 104 also operates based on one or more reference voltages. For example, PGA 104 may use such reference voltage for the purposes of amplification operations, and may also have output range constraints as may be determined by one or more components, such as transistors, included in PGA 104. For example, an output range of PGA 104 may be constrained by a minimum drain-to-source voltage of one or more transistors.

As will be discussed in greater detail below, PGA 104 directly translates a measured voltage into a current domain via an input resistor, such as resistor 108. As shown in FIG. 1, multiple resistors may be included in system 100, and may be selectable via a switch, such as switch 106. Accordingly, as described herein, a plurality of dynamically selectable resistors may be included in or coupled to PGA 104, and may be dynamically selected as appropriate. A value of a selected resistor may be configured such that the value of the input resistor is the inverse of the system transconductance, where R=1/Gm. In this way, the translated current is directly sampled and converted into the digital domain by using data converter 102, which may be an inverter-based Continuous-Time Sigma-Delta ADC. A maximum input voltage range can be adjusted by selecting the appropriate input resistor proportional to 1/Gm.

Figure 2:
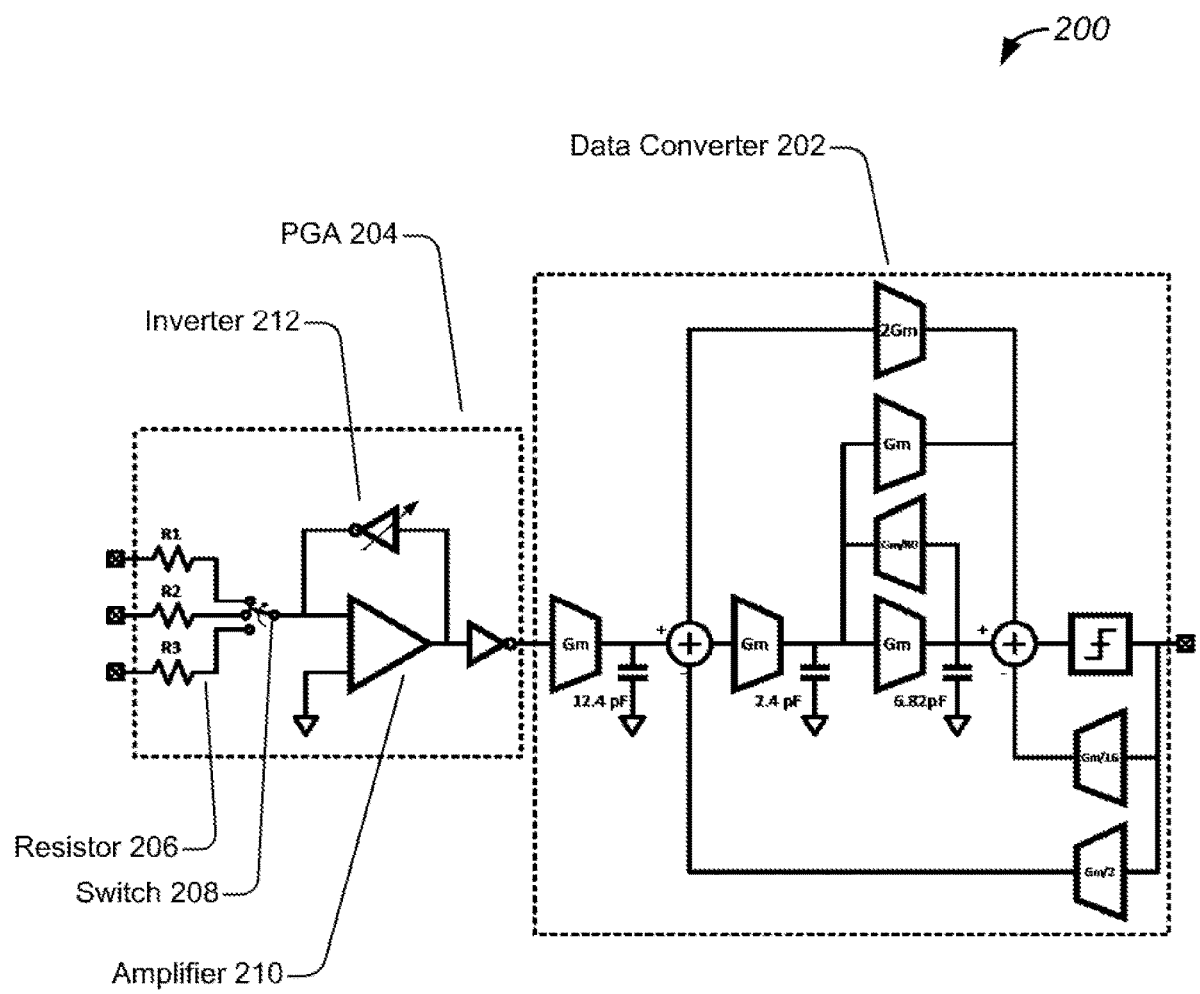
FIG. 2 illustrates another example of a data sampling configuration for data converters, configured in accordance with some embodiments.

FIG. 2 illustrates another example of a data sampling configuration for data converters, configured in accordance with some embodiments. As similarly discussed above, a system, such as system 200, may be configured to provide data sampling capabilities for a data converter even when a sampled signal exceeds an operational range of a data converter. As will be discussed in greater detail below, one or more properties of a data converter, such as data converter 202, may be used to determine a transconductance of a PGA, such as PGA 204.

In various embodiments, data converter 202 is configured to convert analog signals to digital signals. More specifically, data converter 202 includes a configuration of inverters and a comparator to generate a digital stream of bits based on a received analog signal. In various embodiments, each inverter is configured to have its own transfer function and its own transconductance. Moreover, data converter 202 may be configured as a delta-sigma ADC.

System 200 also includes PGA 204. As shown in FIG. 2, PGA 204 includes an amplifier, such as amplifier 210, and is configured to include resistors, such as resistor 206, and switch 208. Accordingly, as similarly discussed above, switch 208 may be used to select between various resistors to modulate a transconductance of PGA 204 in accordance with a transconductance of data converter 202. As will be discussed in greater detail below, matching transconductance parameters of PGA 204 and data converter 202 in this way enables scaling of an input signal that is being monitored to ensure the sampled input stays within an operational range of data converter 202. In this way, direct sampling may continue to be performed even for input voltage ranges that exceed the operational range of data converter 202, and that go beyond the reference voltages and voltage rails used by data converter 202.

In various embodiments, values of the resistors are configured based on operational ranges of systems being monitored. For example, a first resistor having a first resistance may be used for monitoring a battery system that does not exceed 1V. Moreover, a second resistor having a second resistance may be used for monitoring a system that does not exceed 4V. Moreover, a third resistor having a third resistance may be used for monitoring a system that does not exceed 10V. It will be appreciated that while FIG. 2 shows three resistors, any suitable number of resistors may be used for any suitable number of operational ranges. Moreover, such ranges may be determined and configured by an entity, such as a manufacturer.

In some embodiments, operation of switch 208 is controlled by an entity, such as a user. Accordingly, a user may provide an input that controls switch 208, and an appropriate resistor may be selected. In another example, operation of switch 208 may be controlled by one or more other system signals and/or events. For example, coupling of system 200 to another system may be identified based on one or more identifiers associated with a particular bus or system component, and a resistor may be selected based on a designated mapping stored in memory that maps identifiers associated with system components to particular resistances. In this example, such a mapping may have been determined by an entity, such as a user or a manufacturer.

Moreover, PGA 204 includes variable inverter 212 which is configured to provide a gain for amplifier 210. Accordingly, variable inverter 212 includes a plurality of inverters, and a number of inverters used may be programmable selected and varied to vary a gain provided to amplifier 210. In this way, variable inverter 212 is configured to provide variable and programmable gain to amplifier 210.

Figure 3:
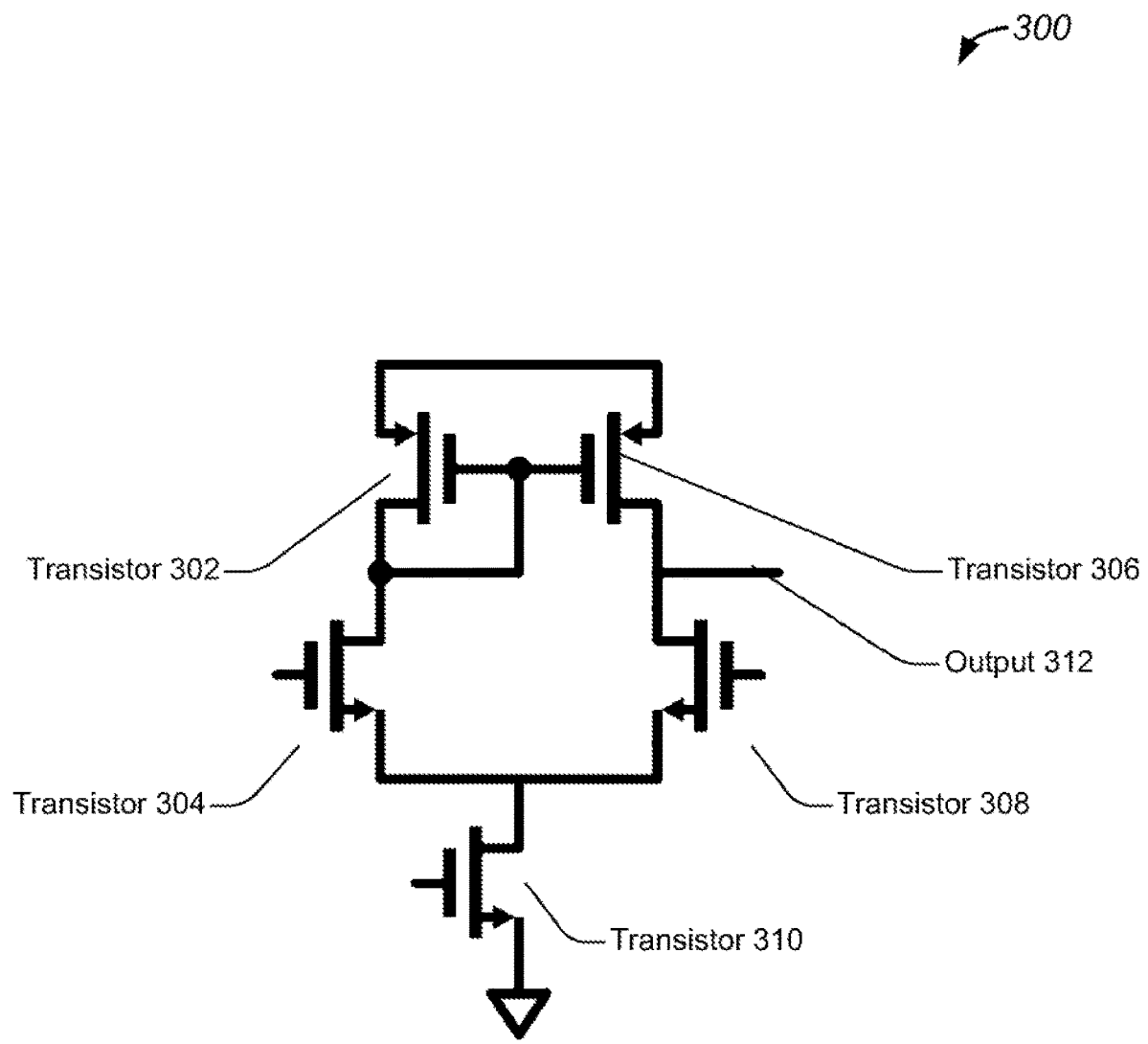
FIG. 3 illustrates an example of a portion of a programmable gain amplifier, configured in accordance with some embodiments.

FIG. 3 illustrates an example of a portion of a programmable gain amplifier, configured in accordance with some embodiments. As similarly discussed above, a PGA may be used to amplify an input provided to a data converter. In various embodiments, an amplifier, such as amplifier 300, is configured to provide such amplification. More specifically, amplifier 300 is configured to provide current mode amplification.

As shown in FIG. 3, amplifier 300 includes various transistors, such as transistor 302, transistor 304, transistor 306, transistor 308, and transistor 310. Furthermore, transistor 304 is configured to have a gate configured as a positive input terminal for amplifier 300. Moreover, transistor 308 is configured to have a gate configured as a negative input terminal for amplifier 300. Output 312 provides an output for amplifier 300. Accordingly, amplifier is configured as a single-stage differential amplifier. As discussed above, an inverter, such as a variable inverter, may be coupled in a feedback configuration between the negative input terminal and the output to provide amplification gain for amplifier 300.

Figure 4:
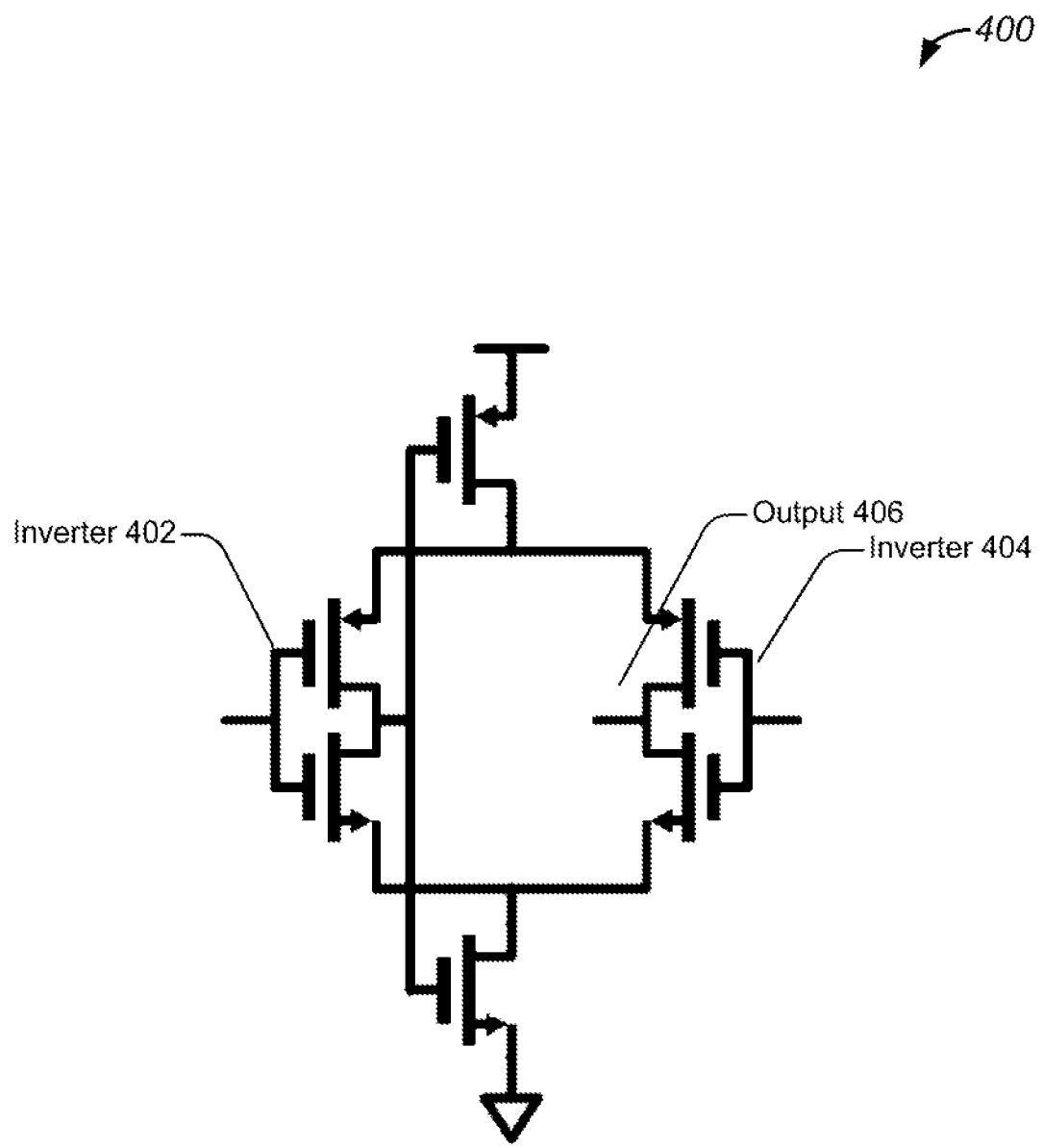
FIG. 4 illustrates another example of a portion of a programmable gain amplifier, configured in accordance with some embodiments.

FIG. 4 illustrates another example of a portion of a programmable gain amplifier, configured in accordance with some embodiments. As similarly discussed above, a PGA may be used to amplify an input provided to a data converter. Accordingly, an amplifier, such as amplifier 400, is configured to provide current mode amplification. In various embodiments, pairs of transistors may be implemented as inverters, such as inverter 402 and inverter 404. Moreover, gates of such transistors may be configured as input terminals. More specifically, gates of transistors included in inverter 402 are configured as a positive input terminal, and gates of transistors included in inverter 404 are configured as a negative input terminal, and an output is provided at output 406. Accordingly, FIG. 4 illustrates an example of how an amplifier may be implemented using transistors configured as inverters. In various embodiments, an inverter is the simplest form of a transconductance unit and does not have internal parasitic nodes. Accordingly, an inverter-based system provides improved bandwidth and power consumption.

Figure 5:
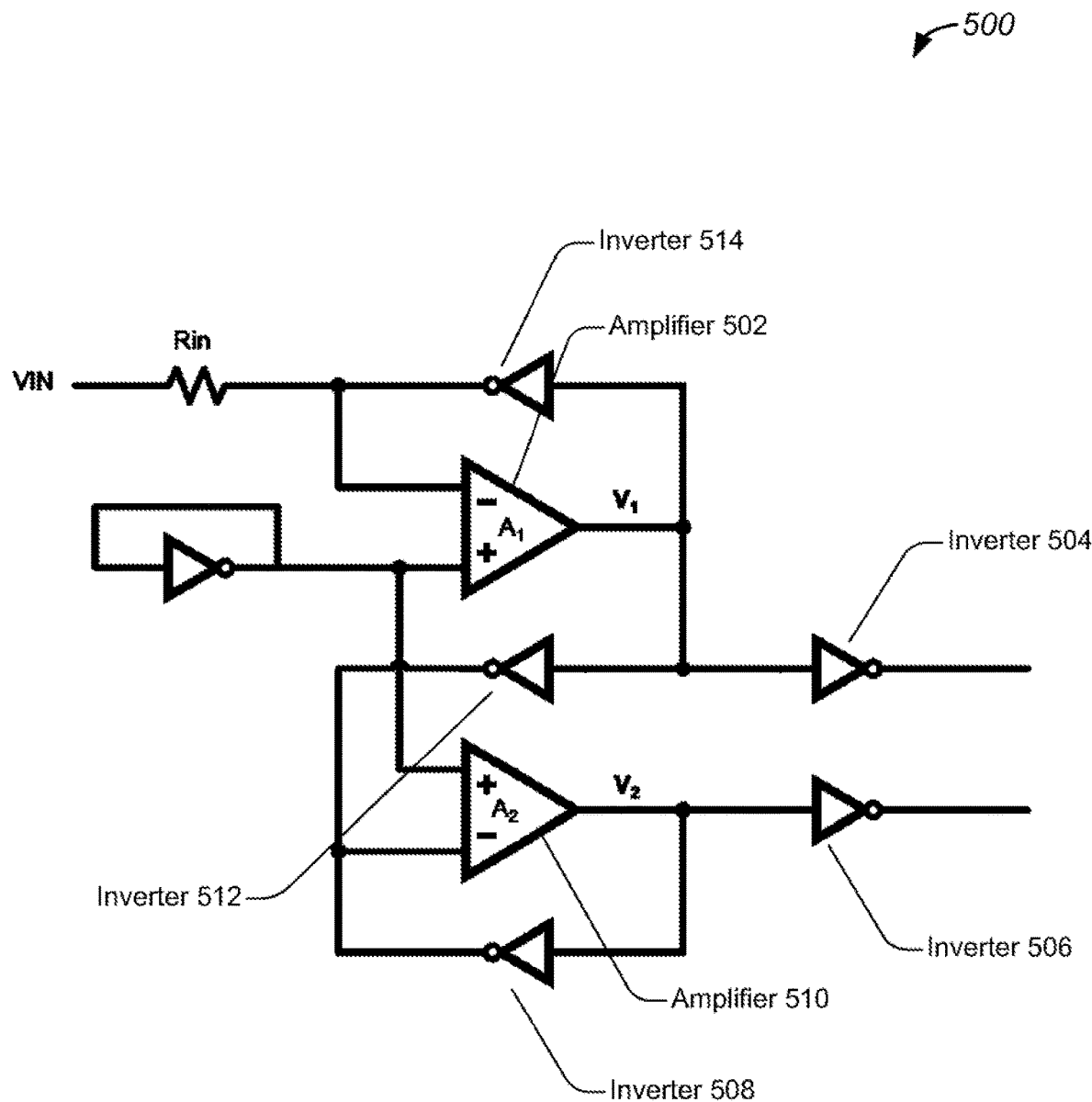
FIG. 5 illustrates yet another example of a portion of a programmable gain amplifier, configured in accordance with some embodiments.

FIG. 5 illustrates yet another example of a portion of a programmable gain amplifier, configured in accordance with some embodiments. More specifically, a device, such as device 500, is configured as a single-ended differential amplifier having programmable gain. Moreover, as will be discussed in greater detail below, device 500 is configured to perform voltage conversion by receiving an input voltage and generating an output current. In this way, device 500 is used to receive a sampled voltage, and generate an output current that is provided to a downstream component, such as a data converter.

As shown in FIG. 5, an input voltage is provided to amplifier 502 causing an output of amplifier 502 to be driven higher, and causing a current to be drawn from inverter 504. An output of inverter 504 is provided as a first current output of device 500 having a first direction. In one example, the first current is a positive current. In various embodiments, the output current that has the same direction as the current flow associated with an output of inverter 514 is defined as positive current.

In some embodiments, device 500 is configured such that an output of amplifier 510 has a voltage that is equal to but opposite of the input voltage. Accordingly, the output voltage of amplifier 510 has an amplitude that equal to the input voltage, but opposite in polarity. The output voltage of amplifier 510 causes current to be generated by inverter 506 and inverter 508. Moreover, an output of inverter 506 is provided as a second current output having a second direction. In one example, the second current is a negative current. In various embodiments, all of the inverters have the same physical dimensions. Moreover, one or more inverters are programmable. More specifically, inverter 508, inverter 512, and inverter 514 have programmable transconductances, and configuration of such transconductances affects the gain of device 500 and overall current amplification. Thus, programmability of the inverters is configured to mimic operation of programmable resistors, and provides gain modification in a similar manner.

Figure 6:
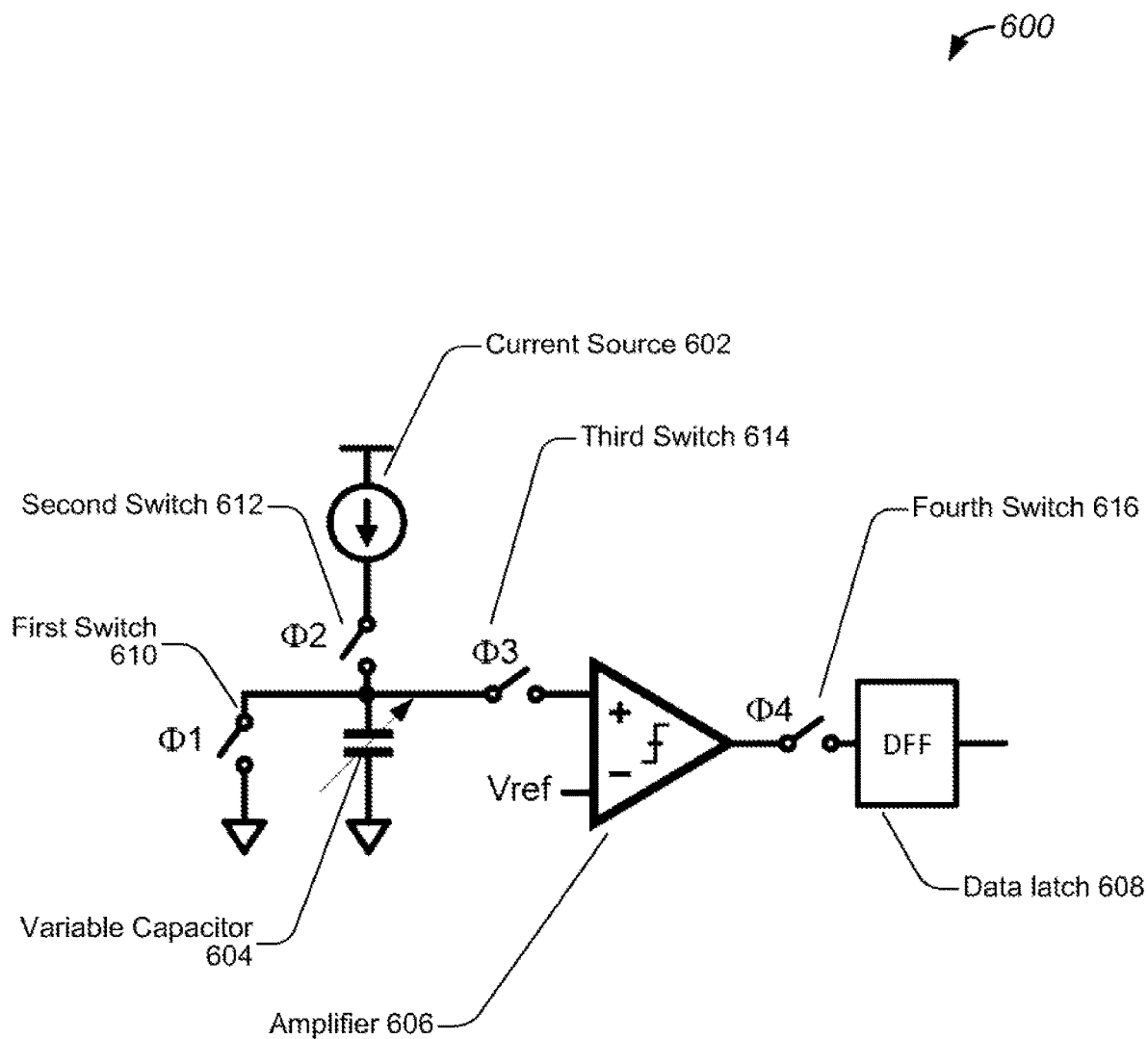
FIG. 6 illustrates an example of a calibration system for a data converter, configured in accordance with some embodiments.

FIG. 6 illustrates an example of a calibration system for a data converter, configured in accordance with some embodiments. A calibration system, such as system 600, is configured to provide internal calibration for a data converter such that the data converter can calibrate and set a time constant based on the current configuration of a system that includes the data converter. Accordingly, system 600 includes current source 602 which is coupled to variable capacitor 604 and amplifier 606 via one or more switches. Moreover, an output of amplifier 606 is latched via data latch 608. Accordingly, a resistance associated with current source 602 is varied, and an output current of current source 602 varies as a result. The output is provided to variable capacitor 604 to generate a ramp signal that is provided to an input of amplifier 606. As shown in FIG. 6, another input of amplifier 606 is fed a reference voltage. As will be discussed in greater detail below, values of variable capacitor 604 may be varied until the voltage across variable capacitor 604 drops below the reference voltage. Accordingly, when such a condition occurs, data latch 608 may generate an output identifying the occurrence of such a condition, and the calibration process may be terminated. As will also be discussed in greater detail below, various switches, such as first switch 610, second switch 612, third switch 614, fourth switch 616, are used to facilitate the application of various clock signals used to apply the ramp current. In various embodiments, the reference voltage is derived from a bandgap voltage reference where the reference value equals the product of a time constant and a period of the calibration clock.

Figure 7:
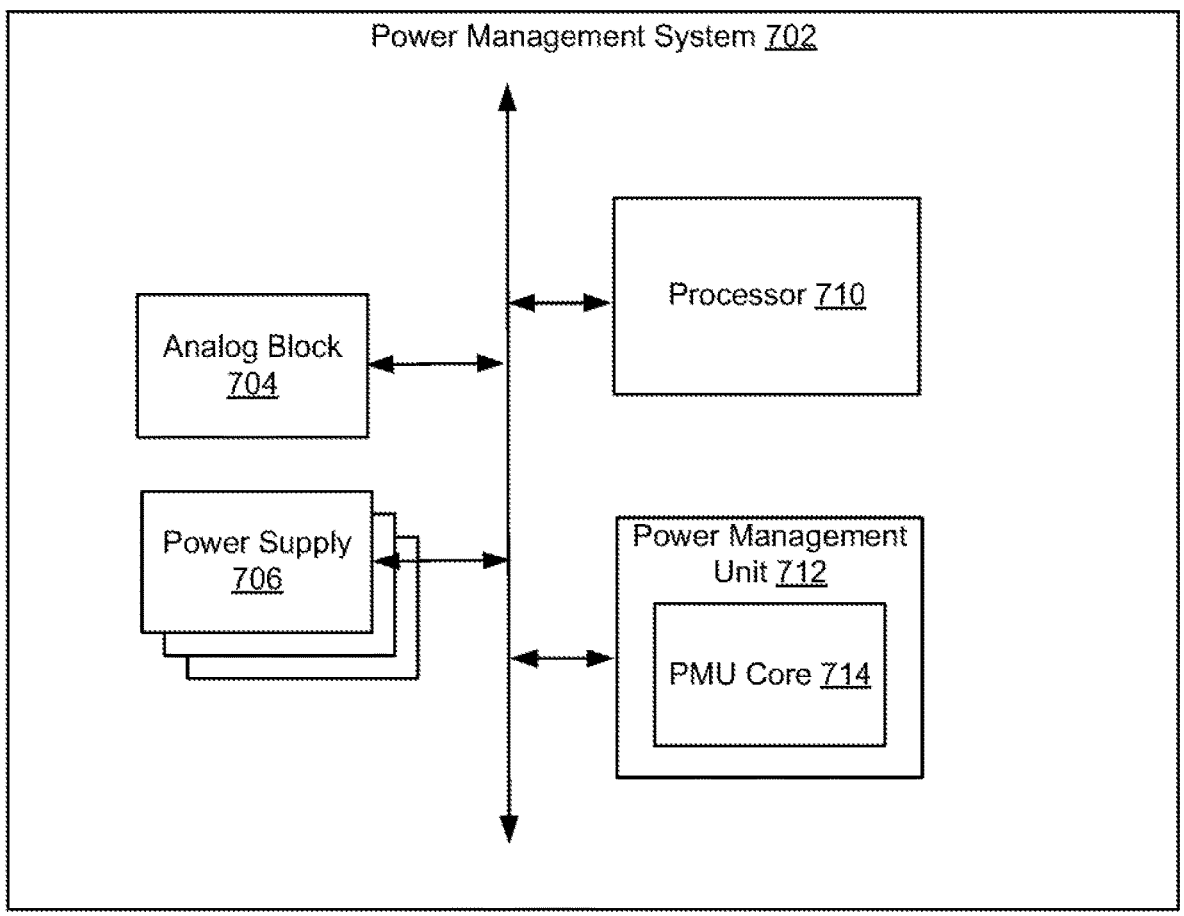
FIG. 7 illustrates an example of a data sampling system, configured in accordance with some embodiments.

FIG. 7 illustrates an example of a data sampling system, configured in accordance with some embodiments. A data sampling system, such as system 700, may include power management system 702 which is configured to sample signals and voltages associated with one or more components coupled to power management system 702. As similarly discussed above, multiple systems and components may be monitored, and may have varying operational ranges.

Power management system 702 includes one or more power supplies, such as power supply 706 which may include a voltage generator. Accordingly, power supply 706 may include one or more batteries which may be used to provide power for a system or device that includes power management system 702. As shown in FIG. 7, power management system 702 may include multiple power supplies having different operational voltage ranges. Accordingly, multiple operational voltage ranges may be monitored and directly sampled using system 700.

In various embodiments, power management system 702 also includes power management unit 712 which is configured to perform various power management operations, such as system monitoring and reference voltage generation. Accordingly, power management unit 712 may include processing elements and circuitry configured to perform data sampling methods and operations disclosed herein. For example, power management unit 712 includes PMU core 714 that is configured to include such processing elements and circuitry.

Power management system 702 further includes processor 710 which may be configured to include processing elements configured to perform processing operations for the system or device that includes power management system 702. Accordingly, processor 710 may be a microcontroller, or any other suitable processing device, such as programmable logic, firmware, or application specific integrated circuit (ASIC). In various embodiments, power management system 702 additionally includes analog block 704 which may be configured to include various buffers, muxes, and other components that may be used by power management system 702.

Figure 8:
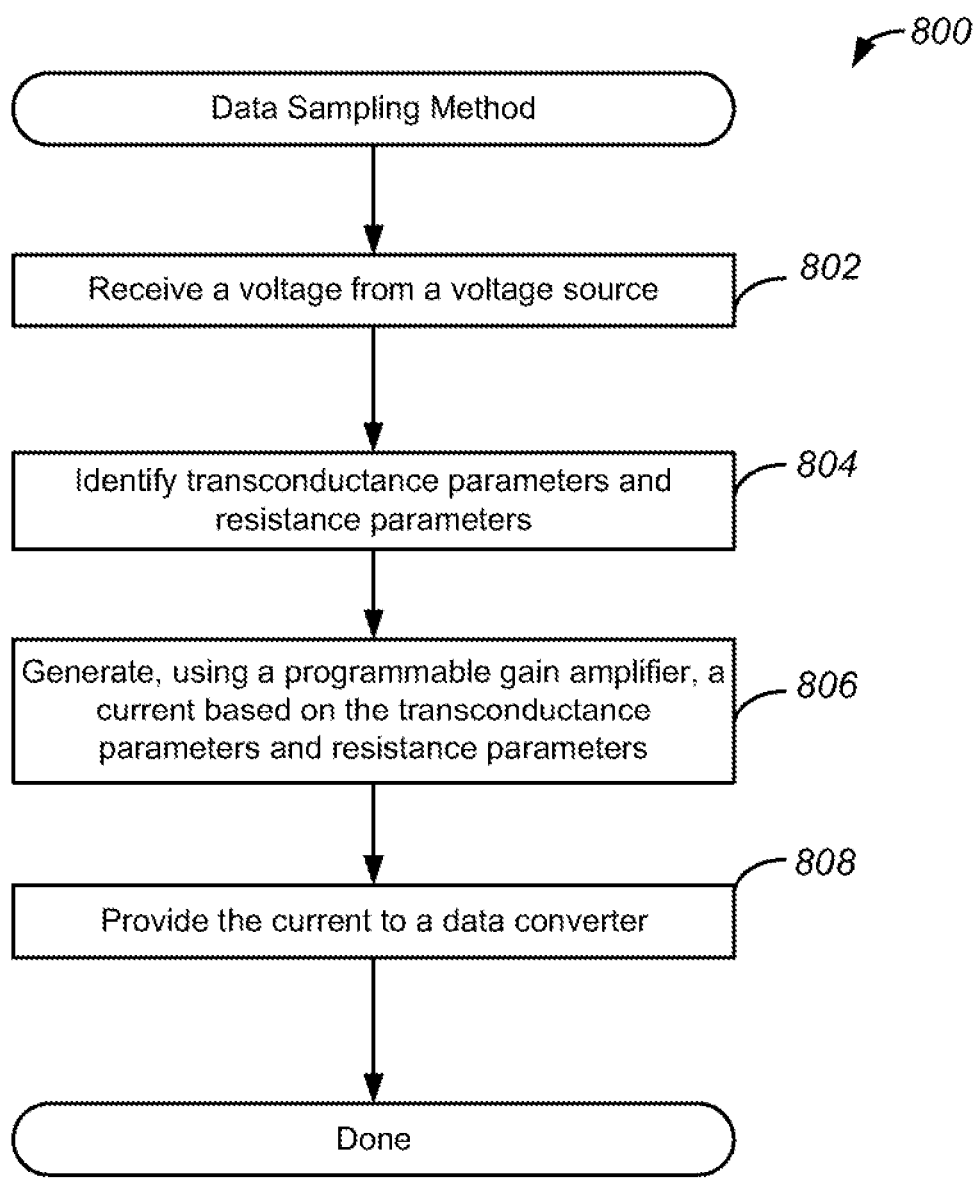
FIG. 8 illustrates an example of a data sampling method, performed in accordance with some embodiments.

FIG. 8 illustrates an example of a data sampling method, performed in accordance with some embodiments. As similarly discussed above, a method, such as method 800, is performed to provide data sampling capabilities for a data converter even when a sampled signal exceeds an operational range of a data converter. Accordingly, method 800 is performed to provide beyond rail direct sampling capabilities for data converters that may be included in power management systems.

Method 800 may perform operation 802 during which a voltage is received from a voltage source. Accordingly, as discussed above, a device, system, or component being monitored generates a voltage signal that is provided to a data sampling system. For example, the voltage signal is a voltage level identifying a current status the voltage source.

As similarly discussed above, the data sampling system is configured to use the voltage signal to obtain one or more voltage measurements.

Method 800 may perform operation 804 during which transconductance parameters and resistance parameters may be identified. Accordingly, transconductance parameters identifying a transconductance of a data converter as well as resistance parameters identifying a selected input resistance are identified. As similarly discussed above, the resistance parameters are selected to configure a transconductance of a PGA to match that of the data converter.

Method 800 may perform operation 806 during which a current is generated, using a PGA, based on the transconductance parameters and resistance parameters. In various embodiments, the PGA is configured as a single-ended differential amplifier, and converts the received input voltage into an output current. Moreover, as discussed above, an input resistor is selected based on one or more parameters of the voltage source, and has a resistance value determined based, at least in part, on transconductance parameters of the data converter.

Method 800 may perform operation 808 during which the current is provided to a data converter. Accordingly, as discussed above, the current is provided from the PGA to the data converter, and the data converter generates an output based on the received current. The output identifies a measurement of the received input voltage.

Figure 9:
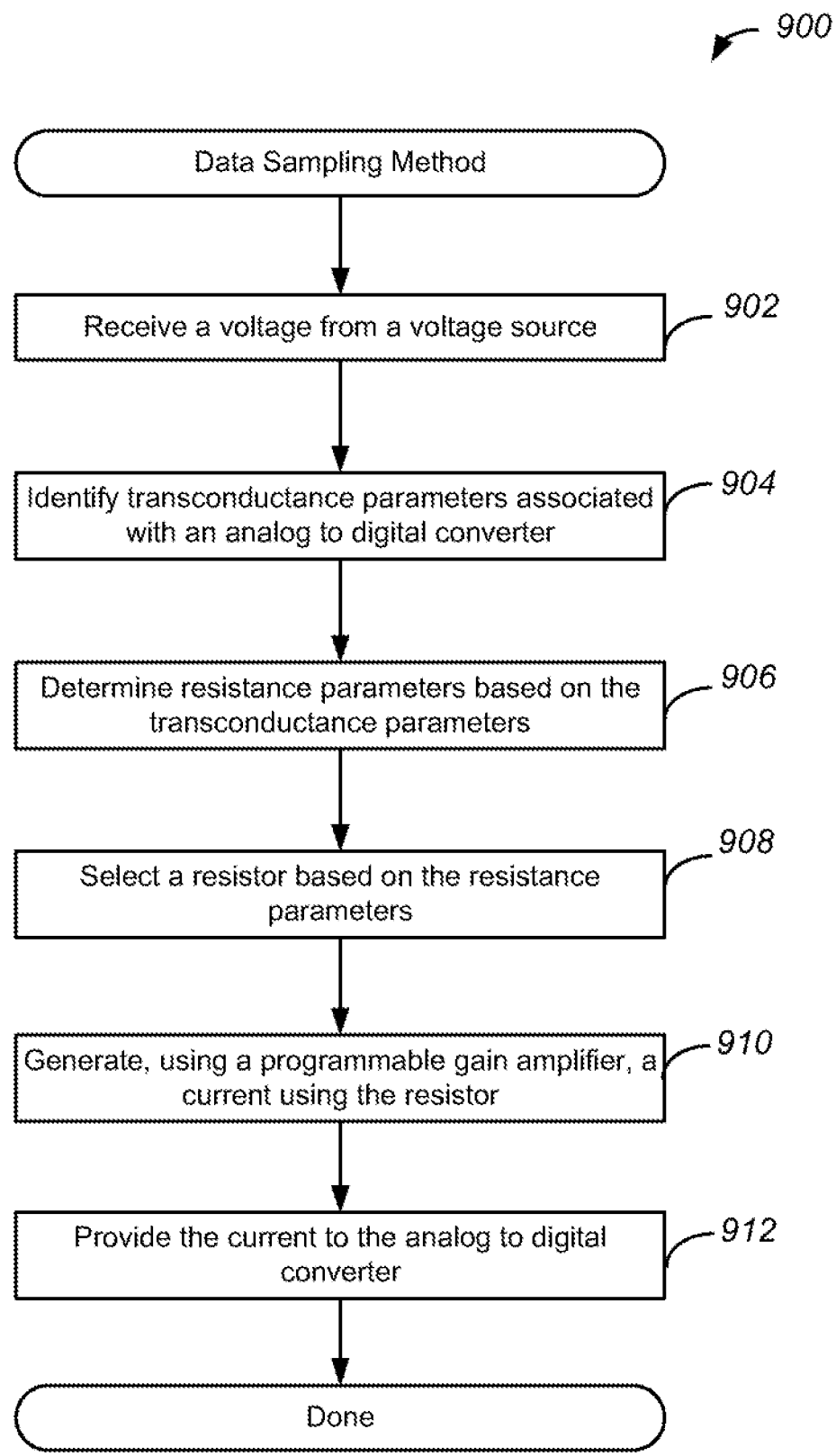
FIG. 9 illustrates an example of a data sampling method, performed in accordance with some embodiments.

FIG. 9 illustrates an example of a data sampling method, performed in accordance with some embodiments. As similarly discussed above, a method, such as method 900, is performed to provide data sampling capabilities for a data converter even when a sampled signal exceeds an operational range of a data converter. As will be discussed in greater detail below, method 900 is performed to provide direct sampling capabilities for data converters across multiple monitored systems, even when operational voltage ranges of such systems exceed the operational range of the data converter.

Method 900 performs operation 902 during which a voltage is received from a voltage source. As discussed above, a device, system, or component being monitored generates a voltage signal that is provided to a data sampling system. For example, the voltage signal is a voltage level identifying a current status the voltage source. As similarly discussed above, the data sampling system is configured to use the voltage signal to obtain one or more voltage measurements. In one example, the voltage source is a power supply, such as a battery, that is being monitored by a power management system. Accordingly, the voltage is received as part of a monitoring process that monitors a health and status of the voltage source.

Method 900 performs operation 904 during which transconductance parameters associated with an analog to digital converter are identified. As similarly discussed above, transconductance parameters identifying a transconductance of a data converter are identified. In various embodiments, such transconductance parameters are determined based on physical parameters of components of the data converter. For example, as similarly discussed above, the data converter includes a configuration of inverters, and each inverter has an associated transconductance. Accordingly, an overall transconductance of the data converter may be determined based on the configuration and transconductances of the inverters. In one example, the data converter may have a transconductance of 2.67 micosiemens. In various embodiments, the transconductance value is configured based on one or more design parameters that may be specified by an entity, such as a manufacturer. For example, a manufacturer may set the transconductance value based on a desired or target input impedance, bandwidth, and/or power consumption.

Method 900 performs operation 906 during which resistance parameters are determined based on the transconductance parameters. As similarly discussed above, the resistance parameters are configured to identify an input resistance used to tune and configure a PGA to have a transconductance that matches the data converter. Accordingly, an input resistance may be identified that equals a maximum expected input voltage divided by the data converter transconductance. For example, if the maximum expected input voltage is 10V, the resistance may be determined by 10/Gm, where Gm is the data converter transconductance.

Method 900 performs operation 908 during which a resistor is selected based on the resistance parameters. Accordingly, during operation 908, one or more components of the PGA are configured such that one or more input resistors are selected to achieve the input resistance identified by the resistance parameters.

Method 900 performs operation 910 during which a current is generated by using a PGA and the selected resistor. As similarly discussed above, in some embodiments, the PGA is configured as a single-ended differential amplifier, and converts the received input voltage into an output current. Accordingly, the PGA may receive the voltage via the selected resistor, and may generate a current based on such received voltage.

Method 900 performs operation 912 during which the current is provided to the analog to digital converter. As discussed above, the current is provided from the PGA to the data converter, and the data converter generates an output based on the received current. The output identifies a measurement of the received input voltage. As also discussed above, in some embodiments, the data converter is an ADC. Accordingly, the generated output is a digital signal identifying one or more features of the received voltage, such as a voltage level.

Figure 10:
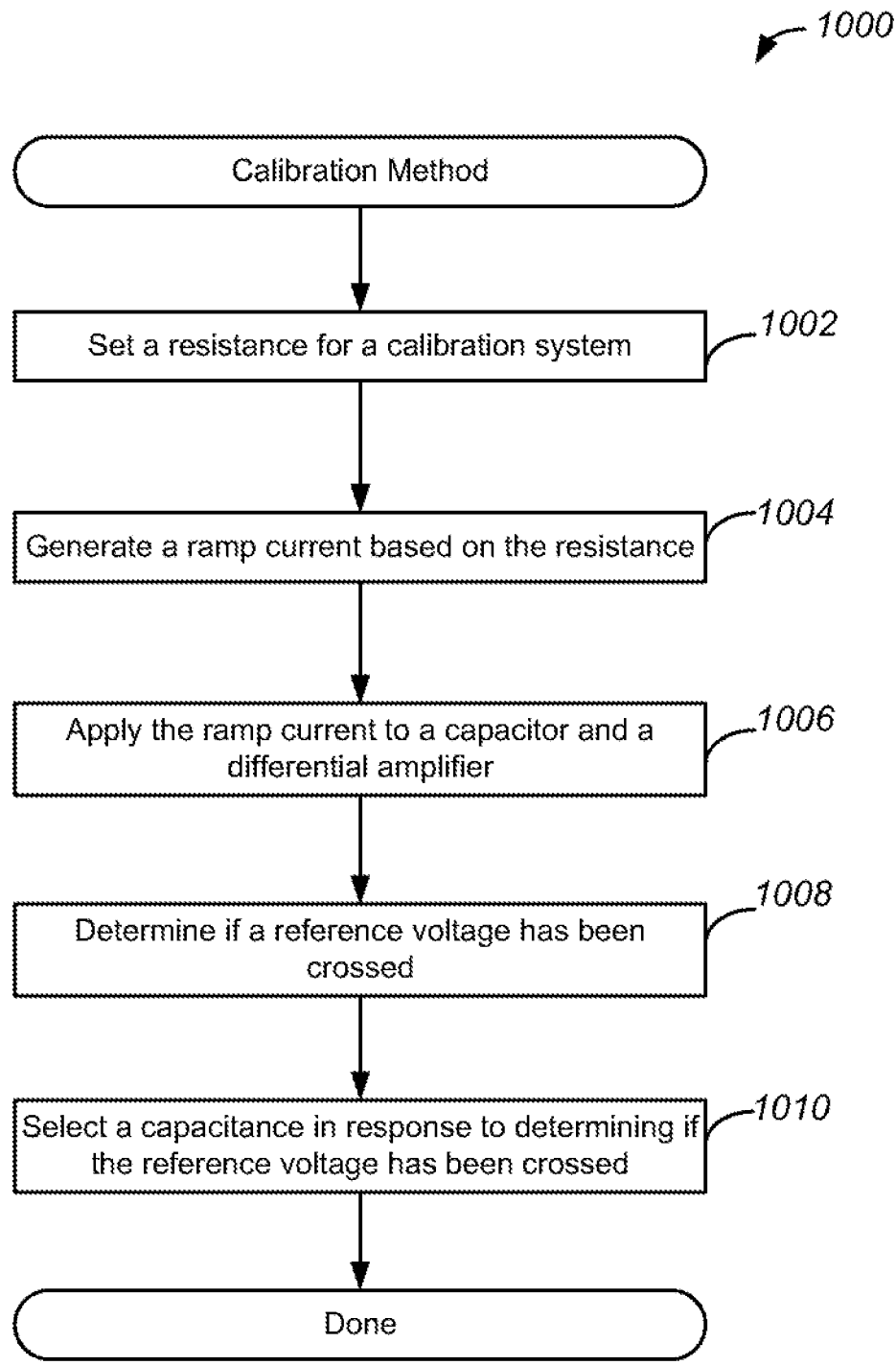
FIG. 10 illustrates an example of a calibration method, performed in accordance with some embodiments.

FIG. 10 illustrates an example of a calibration method, performed in accordance with some embodiments. A calibration method, such as method 1000, is performed for calibrating a data converter such that the data converter can set a time constant based on the current configuration of a system that includes the data converter.

Method 1000 may perform operation 1002 during which a resistance may be set for a calibration system. In various embodiments, a variable resistor is used to vary a resistance of a current source such that an output of the current source may be varied. Accordingly, during operation 1002, the resistance may be set to a designated value, as may have been determined by an entity, such as a manufacturer or user, for the initiation of a calibration process.

Method 1000 may perform operation 1004 during which a ramp current may be generated based on the resistance. Accordingly, the current source may generate a current, also referred to herein as a ramp current, based on the selected resistance. In this way, an output of the current source is inversely proportional to the value of the resistance determined at operation 1002.

Method 1000 may perform operation 1006 during which the ramp current may be provided to a capacitor and a comparator. Accordingly, the ramp current is provided to a terminal of a variable capacitor to apply a voltage across the variable capacitor. The current and associated voltage are also applied to a positive input terminal of a comparator. In various embodiments, the negative input terminal is coupled to a reference voltage. In various embodiments, the reference voltage is derived from a bandgap voltage reference where the value equals the product of a time constant (Gm/C) and a period of the calibration clock.

Method 1000 may perform operation 1008 during which it may be determined if a reference voltage has been crossed. Accordingly, a value of the capacitance of the variable capacitor may be varied, and the voltage across the variable capacitor is compared against the reference voltage by the comparator. The voltage across the variable capacitor eventually crosses the reference voltage when I/C=Gm/C, and causes a change in an output of the comparator. In various embodiments, the value of Gm is proportional to a system transconductance, as similarly discussed above.

Method 1000 may perform operation 1010 during which a capacitance may be selected in response to determining the reference voltage has been crossed. As noted above, a change in the output of the comparator may be detected and identified as a reference voltage crossing. The value of the variable capacitor that resulted in the reference voltage crossing may be identified and used to set a time constant for the data converter, which may be an ADC.

Figure 11:
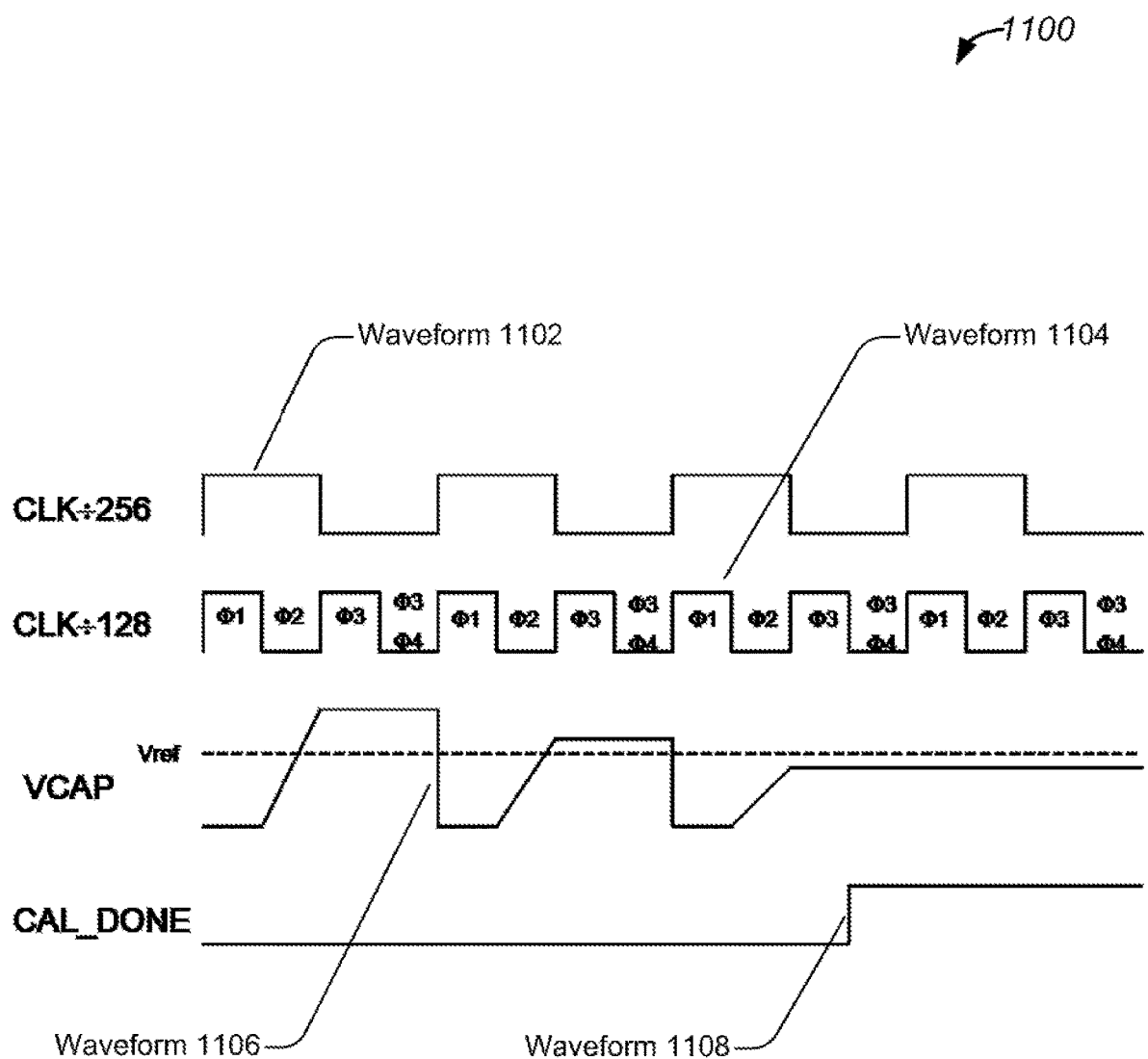
FIG. 11 illustrates an example of a calibration waveform, in accordance with some embodiments.

FIG. 11 illustrates an example of a calibration waveform, in accordance with some embodiments. As discussed above, a current source may be used to apply a ramp current to a variable capacitor and a comparator. Moreover, the application of such a ramp current may be facilitated by several switches. As shown in timing diagram 1100, clock signals, shown by waveform 1102 and waveform 1104, may be used to control various components, such as switches, used to facilitate the application of the ramp current. Moreover, waveform 1106 shows a voltage $V_{CAP}$ across a variable capacitor. As shown in timing diagram 1100, the voltage on the variable capacitor ramps up and is charged, reaches a steady voltage, and then is discharged. Moreover, waveform 1106 shows varying amplitudes for different capacitance values. Waveform 1106 also shows a reference voltage level, and a moment where the amplitude of $V_{CAP}$ when in a steady state, is below the reference voltage. Waveform 1108 illustrates an output of a comparator and/or data latch identifying that such a reference voltage crossing has occurred.

Figure 12:
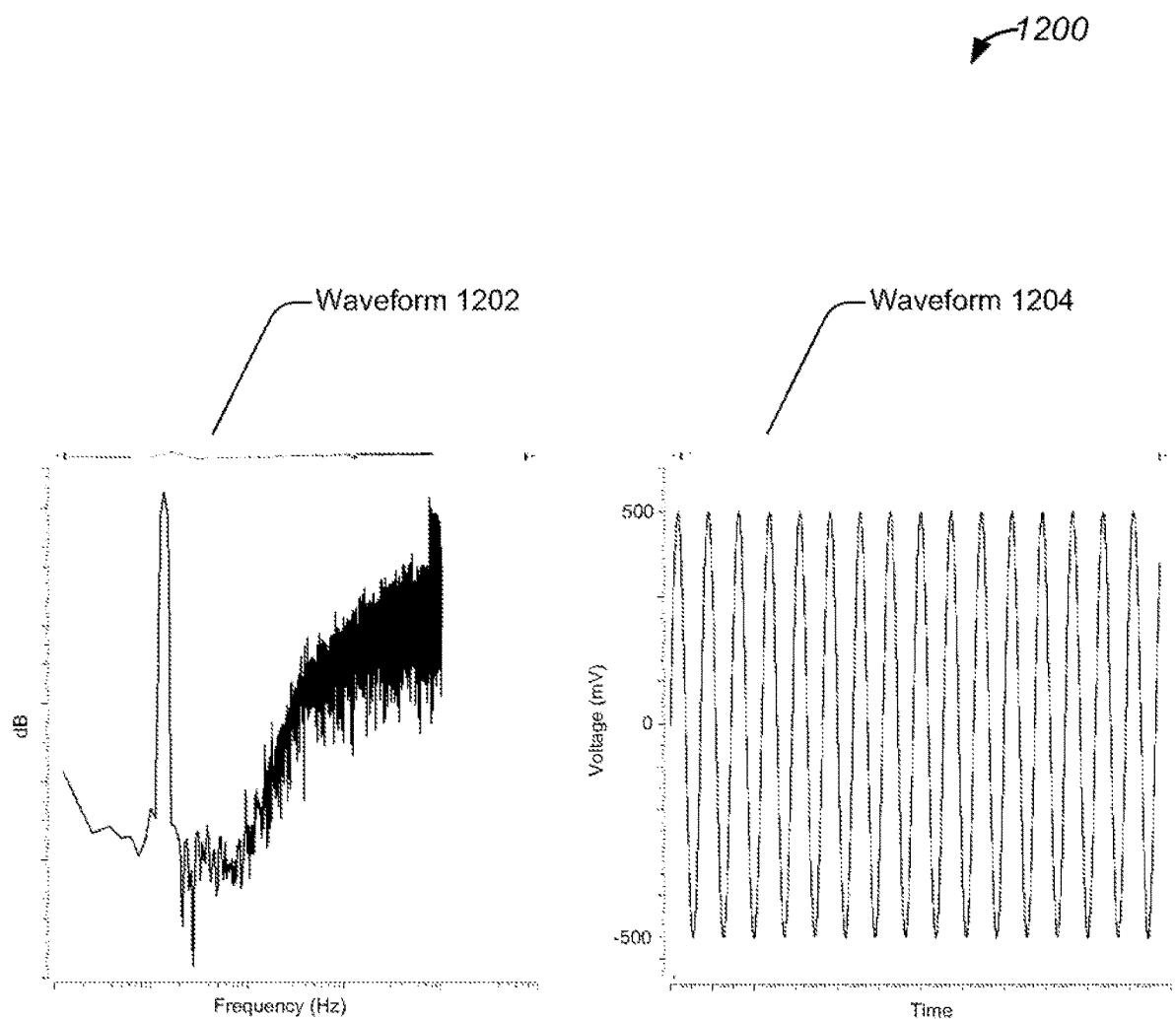
FIG. 12 illustrates an example of a data sampling waveform, in accordance with some embodiments.

FIG. 12 illustrates an example of a data sampling waveform, in accordance with some embodiments. As shown in FIG. 12, waveform 1202 illustrates a representation of an output generated by a data sampling system in response to receiving an input from a voltage source, represented by waveform 1204. More specifically, waveform 1204 illustrates an analog signal having a peak-to-peak amplitude of 1V oscillating at a designated frequency. Waveform 1202 illustrates a spectral representation of an output showing a peak corresponding to that signal and having an amplitude of 1V peak-to-peak, as shown in waveform 1204.

Figure 13:
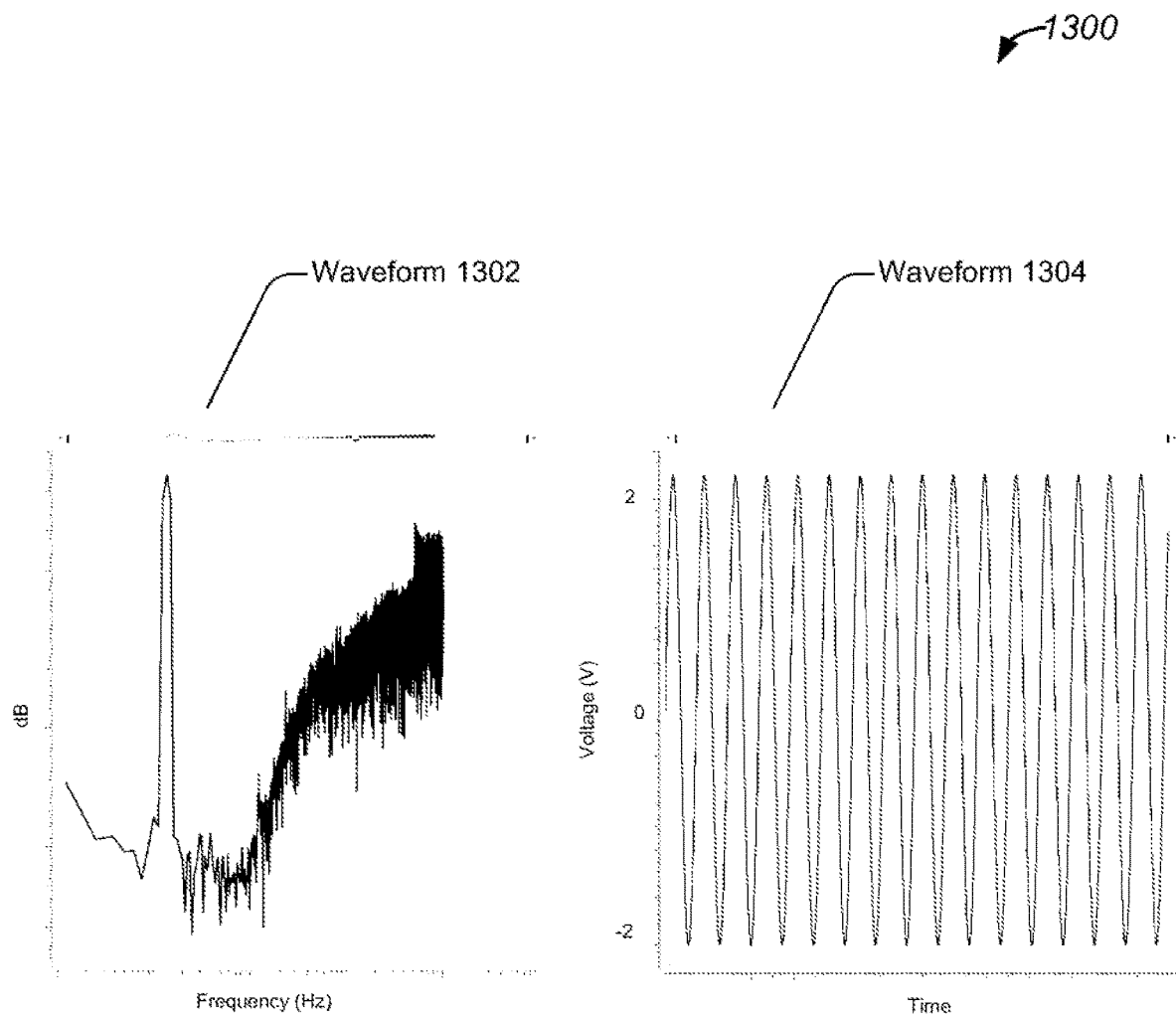
FIG. 13 illustrates another example of a data sampling waveform, in accordance with some embodiments.

FIG. 13 illustrates another example of a data sampling waveform, in accordance with some embodiments. As shown in FIG. 13, waveform 1302 illustrates a representation of an output generated by a data sampling system in response to receiving an input from a voltage source, represented by waveform 1304. In this example, waveform 1304 illustrates an analog signal having a peak-to-peak amplitude of 4V oscillating at a designated frequency. Waveform 1302 illustrates a spectral representation of an output showing a peak corresponding to that signal and having an amplitude of 1V peak-to-peak. Accordingly, despite the increase in the amplitude of the input voltage, the output remains within the operational range of the data converter, and direct sampling is possible.

Figure 14:
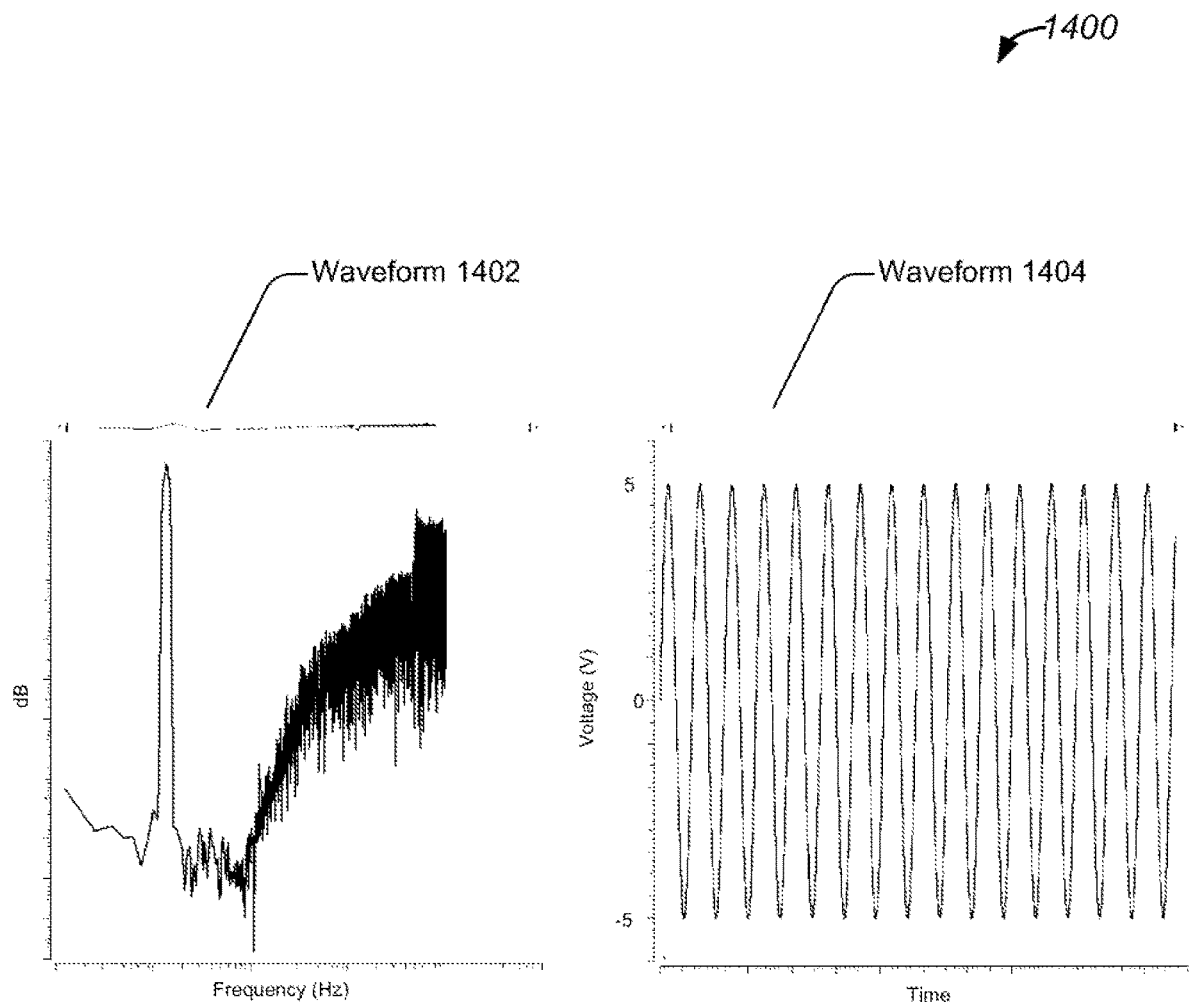
FIG. 14 illustrates yet another example of a data sampling waveform, in accordance with some embodiments.

FIG. 14 illustrates yet another example of a data sampling waveform, in accordance with some embodiments. As shown in FIG. 14, waveform 1402 illustrates a representation of an output generated by a data sampling system in response to receiving an input from a voltage source, represented by waveform 1404. In this example, waveform 1404 illustrates an analog signal having a peak-to-peak amplitude of 10V oscillating at a designated frequency. Waveform 1402 illustrates a spectral representation of an output showing a peak corresponding to that signal and having an amplitude of 1V peak-to-peak. Accordingly, as similarly discussed above, despite the increase in the amplitude of the input voltage to an operational range that exceeds that of the data converter, the output remains within the operational range of the data converter, and direct sampling is still possible.

Although the foregoing concepts have been described in some detail for purposes of clarity of understanding, it will be apparent that certain changes and modifications may be practiced within the scope of the appended claims. It should be noted that there are many alternative ways of implementing the processes, systems, and devices. Accordingly, the present examples are to be considered as illustrative and not restrictive.

What is claimed is:

1. A method comprising:
   receiving a voltage from a voltage source;
   identifying transconductance parameters and resistance parameters associated with a data converter, the transconductance parameters identifying a transconductance of the data converter;
   selecting a resistor from a plurality of dynamically selectable resistors based on the resistance parameters;
   generating, using a programmable gain amplifier, a current based, at least in part, on the selected resistor and the received voltage; and
   providing the current to the data converter.

2. The method of claim 1, wherein the transconductance of the data converter is determined based, at least in part, on a transconductance of a configuration of a plurality of inverters included in the data converter.

3. The method of claim 2, wherein the resistance parameters identify a resistance based on the transconductance of the data converter and an operational range of the voltage source.

4. The method of claim 3, wherein an operational range comprises a peak-to-peak voltage of the voltage source.

5. The method of claim 1, wherein the generating of the current further comprises:
   coupling the selected resistor to an input of the programmable gain amplifier.

6. The method of claim 1, wherein the voltage is received from a power supply.

7. The method of claim 6, wherein the power supply is a battery.

8. The method of claim 1 further comprising:
   calibrating a time constant of the data converter.

9. The method of claim 8, wherein the calibrating further comprises:
   selecting a capacitance for a variable capacitor included in the data converter.

10. A system comprising:
   a voltage source;
   a data converter comprising transconductance parameters identifying a transconductance of the data converter;

a plurality of dynamically selectable resistors configured to select a resistor based on the transconductance parameters and associated resistance parameters; and a programmable gain amplifier configured to generate a current based, at least in part, on the selected resistor and a voltage received from the voltage source.

11. The system of claim 10, wherein the transconductance of the data converter is determined based, at least in part, on a transconductance of a configuration of a plurality of inverters included in the data converter.

12. The system of claim 11, wherein the resistance parameters identify a resistance based on the transconductance of the data converter and an operational range of the voltage source, and wherein an operational range comprises a peak-to-peak voltage of the voltage source.

13. The system of claim 10, wherein the generating of the current further comprises:

coupling the selected resistor to an input of the programmable gain amplifier.

14. The system of claim 10, wherein the voltage source is a battery.

15. The system of claim 10, wherein the data converter is an analog to digital converter.

16. A device comprising:

a data converter comprising transconductance parameters identifying a transconductance of the data converter;

a plurality of dynamically selectable resistors configured to select a resistor based on the transconductance parameters and associated resistance parameters; and a programmable gain amplifier configured to generate a current based, at least in part, on the selected resistor and a voltage received from a voltage source.

17. The device of claim 16, wherein the transconductance of the data converter is determined based, at least in part, on a transconductance of a configuration of a plurality of inverters included in the data converter.

18. The device of claim 17, wherein the resistance parameters identify a resistance based on the transconductance of the data converter and an operational range of the voltage source, and wherein an operational range comprises a peak-to-peak voltage of the voltage source.

19. The device of claim 16, wherein the generating of the current further comprises:

coupling the selected resistor to an input of the programmable gain amplifier.

20. The device of claim 16, wherein the data converter is an analog to digital converter.

* * * * *